United States Patent
Kim (10) Patent No.: US 9,590,215 B2
(45) Date of Patent: Mar. 7, 2017

(54) POWER CONTROL MODULE AND BATTERY PACK INCLUDING THE SAME

(75) Inventor: Dae Hun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 869 days.

(21) Appl. No.: 12/864,518

(22) PCT Filed: Jan. 9, 2009

(86) PCT No.: PCT/KR2009/000126
§ 371 (c)(1),
(2), (4) Date: Sep. 9, 2010

(87) PCT Pub. No.: WO2009/093822
PCT Pub. Date: Jul. 30, 2009

(65) Prior Publication Data
US 2011/0135968 A1    Jun. 9, 2011

(30) Foreign Application Priority Data
Jan. 24, 2008 (KR) .................. 10-2008-0007633

(51) Int. Cl.
*H01M 2/02* (2006.01)
*H01M 2/10* (2006.01)
*H01M 2/34* (2006.01)
*H01M 10/0525* (2010.01)

(52) U.S. Cl.
CPC ....... *H01M 2/1066* (2013.01); *H01M 2/0215* (2013.01); *H01M 2/34* (2013.01); *H01M 10/0525* (2013.01)

(58) Field of Classification Search
CPC ................ H01M 2/0215; H01M 2/1066

USPC .............................................. 429/7
See application file for complete search history.

(56) References Cited

U.S. PATENT DOCUMENTS

| | | | |
|---|---|---|---|
| 5,496,967 A * | 3/1996 | Hashimoto et al. | ......... 174/529 |
| 6,524,732 B1 | 2/2003 | Iwaizono et al. | |
| 2006/0071637 A1 | 4/2006 | Heo et al. | |
| 2007/0194753 A1 | 8/2007 | Sumida et al. | |

FOREIGN PATENT DOCUMENTS

| | | |
|---|---|---|
| EP | 1071147 A1 | 1/2001 |
| JP | 2001-143672 A | 5/2001 |

(Continued)

OTHER PUBLICATIONS

Office Action dated Jan. 29, 2013 in Japanese Application No. 2010-544220, filed Jan. 29, 2009.

(Continued)

*Primary Examiner* — Ula C Ruddock
*Assistant Examiner* — Frank Chernow
(74) *Attorney, Agent, or Firm* — Saliwanchik, Lloyd & Eisenschenk (57) ABSTRACT

Disclosed are a power control module and a battery pack having the same. The battery pack includes a housing, a battery cell received in the housing and including a power terminal, a power control module provided at one side thereof with a first connection terminal, provided at an opposite side thereof with a battery connection terminal connected with the power terminal, and having a structure in which chip parts are packaged, and a cell cover coupled with an upper portion of the housing.

10 Claims, 6 Drawing Sheets

(56) References Cited

FOREIGN PATENT DOCUMENTS

| JP | 2001-196048 A | 7/2001 |
| JP | 2005-251577 A | 9/2005 |
| JP | 2005-347225 A | 12/2005 |
| JP | 2006-066290 A | 3/2006 |
| JP | 2006-156112 A | 6/2006 |
| JP | 2007-220576 A | 8/2007 |

OTHER PUBLICATIONS

Notice of Allowance dated Jul. 16, 2013 in Japanese Application No. 2010-544220, filed Jan. 29, 2009.

* cited by examiner

POWER CONTROL MODULE AND BATTERY PACK INCLUDING THE SAME

TECHNICAL FIELD

The embodiment relates to a power control module and a battery pack having the same.

BACKGROUND ART

A portable terminal device makes electrical communication between a user and another user or a service provider to provide various services such as a voice call, a short message service, a multimedia service, and an entertainment service.

The portable terminal device is commercialized in various types such as a bar type, a flip type, a folder type, a sliding type, a pop-up type, and a swing type according to the outer appearances thereof to satisfy different tastes of users.

The portable terminal device is equipped with a battery to supply power. The battery is detachably coupled with the rear surface of the portable terminal device. Recently, batteries having various shapes have been manufactured while taking the style of the portable terminal device into consideration.

DISCLOSURE

Technical Problem

The embodiment provides a power control module having a single package structure and a battery pack having the same.

The embodiment provides a power control module, in which chip parts in the form of a bare die are packaged as a single integrated circuit and a battery pack having the same.

Technical Solution

According to the embodiment, the power control module includes a substrate provided at one side thereof with a chip part, a resin member formed at one side of the substrate, a first connection terminal at an opposite side of the substrate, and a battery connection terminal having one end electrically connected to both ends of the opposite side of the substrate, and an opposite end extending along a surface of the resin member.

According to the embodiment, the battery pack includes a housing, a battery cell received in the housing and including a power terminal, a power control module provided at one side thereof with a first connection terminal, provided at an opposite side thereof with a battery connection terminal connected with the power terminal, and having a structure in which chip parts are packaged, and a cell cover coupled with an upper portion of the housing.

Advantageous Effects

According to the embodiment, the manufacturing cost of the power control module can be reduced.

According to the embodiment, the manufacturing process of a battery pack can be improved.

BEST MODE

Mode for Invention

Hereinafter, embodiments will be described with reference to accompanying drawings. In addition, "on" or "under" of each layer is determined based on the drawing. The size of each component shown in the drawings is one example for the purpose of explanation, and the embodiments are limited thereto.

Figure 1:
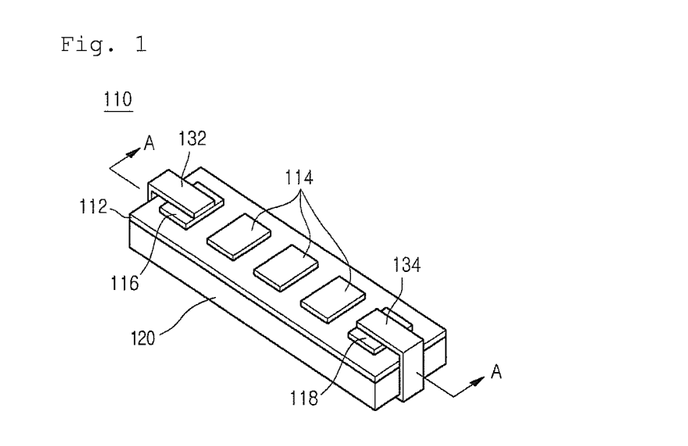
FIG. 1 is a perspective view showing a power control module according to a first embodiment.
Figure 2:
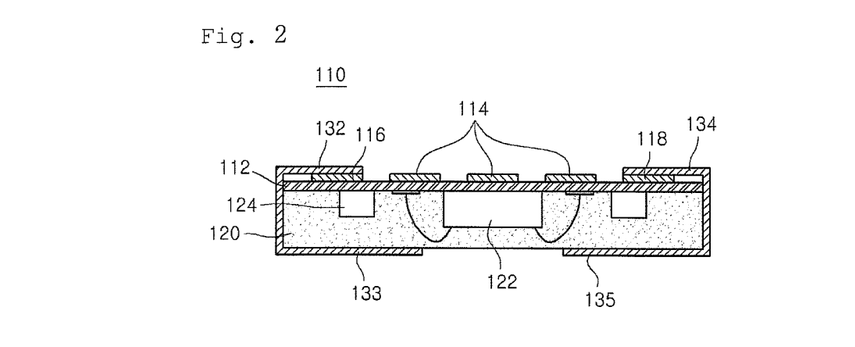
FIG. 2 is a side sectional view taken along line A-A of FIG. 1.

FIG. 1 is a perspective view showing a power control module 110 according to the first embodiment, and FIG. 2 is a sectional view taken along line A-A of the power control module 110 of FIG. 3.

Referring to FIGS. 1 and 2, the power control module 110 includes a substrate 112, chip parts 122 and 124, and a resin member 120.

The power control module 110 includes a battery protection circuit to detect an overcharge, overdischarge, or overcurrent state of a battery cell thereby protecting the battery cell from the overcharge, overdischarge, or overcurrent, and is realized in a single package. The power control module 110 may include a circuit to detect the temperature of the battery cell to protect the battery cell.

The power control module 110 has a single package structure in which the chip parts 122 and 124 of the battery protection circuit are integrated. The chip parts 122 and 124 in the form of a bare die are installed below the substrate 112. The chip parts 122 and 124 may be provided by taking the electrical and mechanical characteristics of a switch device such as a field effect transistor (FET), a control IC, a passive device, a thermistor, or a read only memory (ROM) into consideration.

After the chip parts 122 and 124 have been manufactured on a bare wafer, the chip parts 122 and 124 are mounted in the form of a bare die on the substrate 112. The first chip part 122 is a passive device such as a control IC. The first chip part 122 is attached to a bottom surface of the substrate 112 and connected to the substrate 112 through a wire. The control IC is realized by integrating necessary parts selected from among an OP amp, an oscillator, a counter, a logic circuit, a level shifter, a short director, a delay, a transistor, and a resistor. In addition, a switch device such as a FET may be provided in the vicinity of the control IC, but the embodiment is not limited thereto. If a plurality of first chip parts 122 are provided, the first chip parts 122 are stacked in a multiple structure such that the first chip parts 122 are realized in the form of a multiple chip. The second chip part 124 includes a passive device having the form of a bare die, and the passive device includes a resistor or a capacitor.

In addition, the power control module 110 may be realized in the form of a single chip and/or a multiple chip. In addition, the power control module 110 may further include another chip part, but the embodiment is not limited thereto.

The first and second chip parts 122 and 124 are electrically connected to each other through a line pattern of the substrate 112, so that the first and second chip parts 122 and 124 may be realized in the form of an IC chip.

The resin member 120 is formed under the substrate 112. The resin member 120 is formed at a predetermined thickness under the substrate 112, and protects the first and second chip parts 122 and 124 by encapsulating the first and second chip parts 122 and 124. The resin member 120 may be formed through injection molding using resin material such as silicon or epoxy, but the embodiment is not limited thereto.

The substrate 112 is provided thereon with a first connection terminal 114, and second connection terminals 116 and 118. The first connection terminal 114 is provided on a central portion of the substrate 112, and the second connection terminals 116 and 118 are provided at both sides of the first connection terminal 114.

The first connection terminal 114 is used to output battery power. The first connection terminal 114 may include three terminals. The first connection terminal 114 includes a positive (+) terminal, a reference terminal, and a negative (−) terminal. The positive (+) and negative (−) terminals are connected to a portable terminal device. The reference terminal is used to protect the battery cell. In other words, the reference terminal is used to sense the increase of the temperature caused by an abnormal operation of the battery cell to cut off the battery cell.

In addition, the first connection terminal 114 may include three to five terminals, but the embodiment is not limited thereto.

First ends of battery connection terminals 132 and 134 are electrically connected to the second connection terminals 116 and 118, respectively. The battery connection terminals 132 and 134 are bent along an outer portion of the substrate 112. Second ends 133 and 135 of the battery connection terminals 132 and 134 extend to the bottom surface of the resin member 120, in which the second ends 133 and 135 are opposite to the first ends. The battery connection terminals 132 and 134 may be realized by using a nickel (Ni) plate, but the embodiment is not limited thereto.

The second ends 133 and 135 of the battery connection terminals 132 and 134 may be provided on one lateral surface of the resin member 120, but the embodiment is not limited thereto.

The second ends 133 and 135 of the battery connection terminals 132 and 134 may be provided at one side of the power control module 110, and the first connection terminal 114 may be provided at an opposite side of the power control module 110. In other words, the battery connection terminals 132 and 134 may be provided in opposition to the first connection terminal 114.

The battery connection terminals 132 and 134 connect the power control module 110 with the battery cell.

Figure 3:
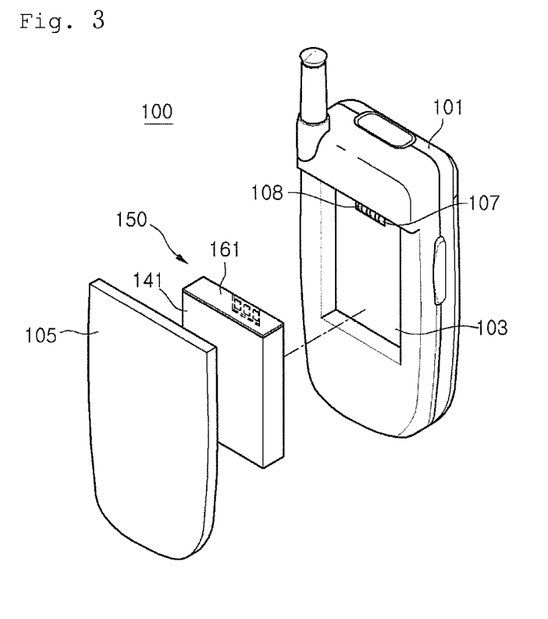
FIG. 3 is an exploded perspective view showing a portable terminal device according to a second embodiment.

FIG. 3 is an exploded perspective view showing a portable terminal device according to the second embodiment.

Referring to FIG. 3, a portable terminal device 100 includes a body 101, a battery pack 150, and a battery pack cover 105.

The portable terminal device 100 employs a battery pack 150 as a power supply, and the battery pack 150 is installed in or separated from a pack receiving portion 103 of the body 101. In this case, the battery pack 150 may be locked or unlocked by a locking portion (not shown) installed in the pack receiving portion 103 of the body 101. The locking structure may be modified within the technical scope of the embodiment, and various locking structures may be employed.

A pack connection terminal 107 is provided at an upper portion 108 of the pack receiving portion 103 of the body 101. The pack connection terminal 107 corresponds to the first connection terminal 114 of the power control module 110 of FIG. 1.

The battery pack 150 includes a housing 141 having the battery cell and the power control module (110 of FIG. 1), and a cell cover 161 coupled with an upper portion of the housing 141. The detailed structure of the battery pack 150 will be described with reference to FIG. 4 later.

If the battery pack 150 is received in the pack receiving portion 103 of the body 101, the battery pack cover 105 is coupled with the body 101 to protect the battery pack 150. A charging terminal (not shown) connected with a charger may be exposed through the battery pack cover 105 or the body 101. The charging terminal may be located at various positions.

Although the embodiment has been described in that the portable terminal device 100 is a folder-type terminal, the portable terminal device 100 is applicable to a bar-type terminal, a flip-type terminal, a sliding-type terminal, a popup-type terminal, and a swing-type terminal. In addition, the battery pack 150 may be applicable to various portable terminal devices such as a portable multimedia player (PMP) or an MPG player, but the embodiment is not limited thereto.

In addition, the battery pack 150 may be separated from the battery pack cover 105, or integrated with the battery pack cover 105, but the embodiment is not limited thereto.

Figure 4:
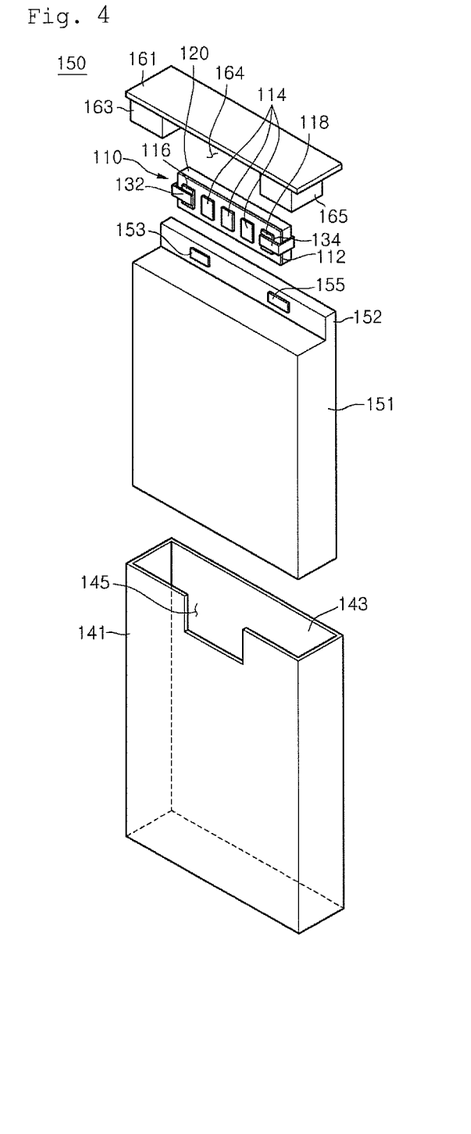
FIG. 4 is an exploded perspective view showing the battery pack of FIG. 3.
Figure 5:
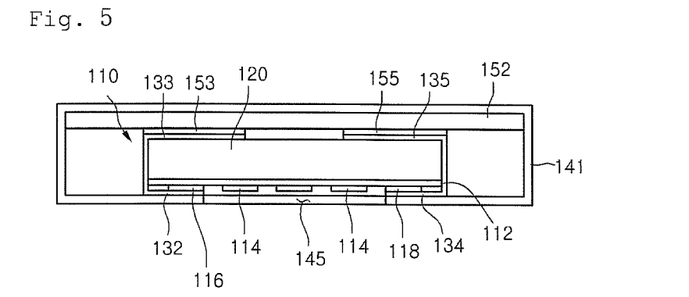
FIG. 5 is a plan view showing the arrangement of a battery cell and a power control module in the battery pack of FIG. 4.
Figure 6:
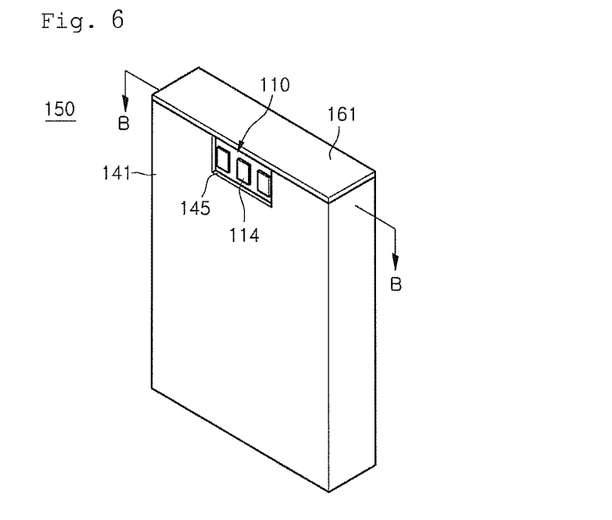
FIG. 6 is a perspective view showing the assembled state of the battery pack according to the second embodiment.
Figure 7:
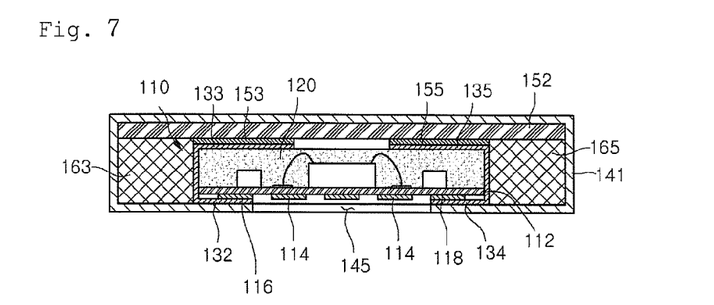
FIG. 7 is a side sectional view taken along line B-B of FIG. 6.

FIGS. 4 to 6 are views showing the battery pack 150 of FIG. 6. FIG. 4 is an exploded perspective view showing the battery pack 150 of FIG. 3. FIG. 5 is a plan view showing the arrangement of the power control module 110 and the battery cell of FIG. 4. FIG. 6 is a perspective view showing the assemble state of the battery pack of FIG. 4, and FIG. 7 is a side sectional view taken along line B-B of FIG. 6.

Referring to FIGS. 3 and 4, the battery pack 150 includes the housing 141, the battery cell 151, the power control module 110, and the cell cover 161.

The housing 141 includes an upper portion, which is open, and a groove 143 having a predetermined depth. A terminal groove 145 is formed at an upper portion of a front surface of the housing 141, and may communicate with an open lateral surface.

The housing 141 has a predetermined shape to receive the battery cell 151 therein. For instance, the housing 141 may have a shape formed with a polygonal groove, or a cover shape capable of covering three sides (e.g., a bottom surface and both lateral surfaces) of the battery cell 151. The shape of the housing 141 may be modified within the technical scope of the embodiment.

The battery cell 151 may include a lithium ion (Li-ion) battery cell. The Li-ion battery cell represents high energy density and high operating voltage. A pole plate is hardly lost when the battery cell is discharged, so that the Li-ion battery cell has superior conservation force. Since the Li-ion battery cell has an improved charge capacity, the life span of the Li-ion battery cell is increased. In addition, the Li-ion battery cell has light weight, a user easily carry the Li-ion battery cell. According to the embodiment, the battery cell is classified into a lead acid battery cell, a nickel-cadmium battery cell, and a nickel hydride battery cell, but the embodiment is not limited thereto.

A module connection portion 152 protrudes from a rear end of an upper portion of the battery cell 151, and a plurality of power terminals 153 and 155 are provided on a front surface of the module connection portion 152. The power terminals 155 and 153 may be realized by using the Ni plate, and act as a positive (+) terminal and a negative (−) terminal, respectively.

The power control module 100 provides the path for charge or discharge of the battery cell 151, and detects the overcharge, overdischarge, and overcurrent of the battery cell 151 to prevent the battery cell 151 from erroneously operating. The power control module 100 protects the battery cell 151 from being overheated or exploded.

The power control module 110 is realized in a single package structure in which a switching device such as an FET, a control IC, a passive device, a thermistor, and a ROM are integrated as a bare die chip part. The description about the power control module 110 will refer to the description based on FIGS. 1 and 2.

The power control module 110 includes the battery protection circuit. The power control module 110 is provided at one side (front surface) thereof with the first connection terminal 114, and provided at an opposite side (rear surface) thereof with the battery connection terminals 132 and 134.

The power control module 110 is provided at the front surface of the upper portion of the battery cell 151. The battery connection terminals 132 and 134 of the power control module 110 make contact with the power terminals 153 and 155 of the battery cell 151. In this case, the battery connection terminals 132 and 134 may adhere to the power terminals 153 and 155 by using a conductive adhesive or may be electrically connected with the power terminals 153 and 155 through a bonding scheme, but the embodiment is not limited thereto.

The first connection terminal 114 of the power control module 110 may be exposed through the terminal groove 145 provided at the front surface of the housing 141. In this case, the power control module 110 is fitted between the module connection portion 152 of the battery cell 151 and the housing 141.

Referring to FIG. 5, the battery cell 151 is received in the housing 141, and the power control module 110 is coupled with the upper portion of the battery cell 151. In this case, the power control module 110 is provided at the center of a front end of the module connection portion 152 of the battery cell. At this time, the battery connection terminals 132 and 134 of the power control module 110 make contact with the power terminals 153 and 155 of the battery cell 151, and the first connection terminal 114 is exposed through the terminal groove 145 of the housing 141.

The cell cover 161 is provided at both sides of the lower portion thereof with module guide protrusions 163 and 165. The module guide protrusions 163 and 165 are located at both sides of the front end of the battery cell 151 to support both sides of the power control module 110.

The cell cover 161 is coupled with the upper portion of the housing 141, thereby completely assembling the battery pack 150 shown in FIG. 6. The first connection terminal 114 of the power control module 110 is exposed through the upper portion of the front surface of the battery pack 150.

The first connection terminal 114 of the power control module 110 are connected with the pack contact terminal 107 of the body 101 shown in FIG. 3, so that the power of the battery cell can be supplied to the body 101.

Referring to FIG. 7, the module guide protrusions 163 and 165 of the cell cover 161 support both sides of the power control module 110, thereby preventing the power control module 110 from moving leftward or/and rightward.

Figure 8:
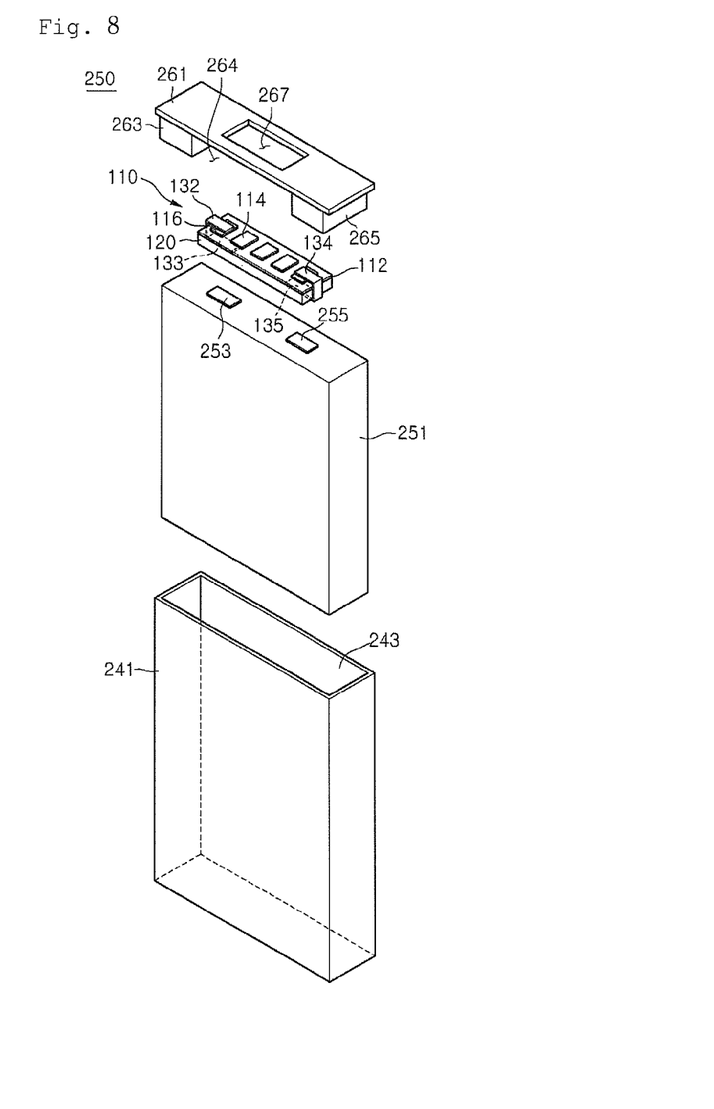
FIG. 8 is an exploded perspective view showing a battery pack according to the third embodiment.
Figure 9:
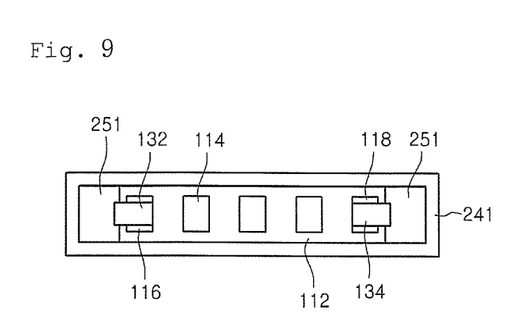
FIG. 9 is a plan view showing the arrangement of a battery cell and a power control module in the battery pack of FIG. 8.
Figure 10:
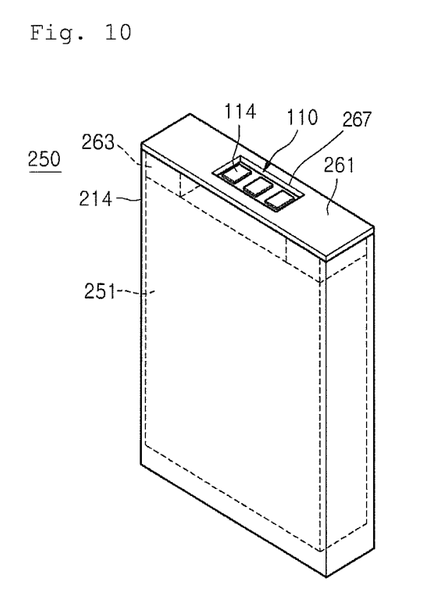
FIG. 10 is a perspective view showing the battery pack of FIG. 8.

FIGS. 8 to 10 are view showing a battery pack 250 according to a third embodiment. FIG. 7 is an exploded perspective view showing the battery pack 250 of FIG. 7. FIG. 9 is a plan view showing the assembled state of the power control module 110, and FIG. 10 is a perspective view showing the battery pack 250. Hereinafter, the third embodiment will be described while focusing the difference from the first and second embodiments, and the same reference numerals will be assigned the same elements in order to avoid redundancy.

Referring to FIGS. 8 to 10, the battery pack 150 includes a housing 243, a battery cell 251, the power control module 110, and a cell cover 261.

The battery cell 251 is received in the housing 243, and a plurality of power terminals 253 and 255 are provided on a top surface of the battery cell 251. The power terminals 253 and 255 may be realized by using a Ni plate.

The top surface of the battery cell 251 is flat, and the power terminals 253 and 255 are spaced apart from each other.

The power control module 110 according to the third embodiment has the same structure as that of the first embodiment, so the detailed description about the power control module 110 according to the third embodiment will refer to the description based on FIGS. 1 and 2.

The battery connection terminals 132 and 134 of the power control module 110 are provided at a lower portion of the power control module 110 such that the battery connection terminals 132 and 134 correspond to the power terminals 253 and 255 of the battery cell 251. The first connection terminal 114 of the power control module 110 is provided at the upper portion of the power control module 110 such that the first connection terminal 114 may be exposed over the batter pack 250

The cell cover 261 is provided at both sides of a lower portion thereof with module guide protrusions 263 and 265, and provided therein with a terminal groove 267. The terminal groove 267 corresponds to the first connection terminal 114 of the power control module 110.

Referring to FIGS. 8 and 9, the battery cell 251 is received in an internal groove 243 of the housing 251, and the power control module 110 is located on the battery cell 251. In this case, the battery connection terminals 132 and 134 of the power control module 110 are electrically connected to the power terminals 253 and 255 of the battery cell 251.

In this case, the first connection terminal 114 of the power control module 110 is exposed upwardly.

The cell cover 261 is coupled with the upper portion of the housing 251. The module guide protrusions 263 and 265 of the cell cover 261 support both sides of the top surface of the battery cell 251.

Referring to FIG. 10, the terminal groove 267 of the cell cover 261 exposes the first connection terminal 114 of the power control module 110. Accordingly, the first connection terminal 114 is provided at an upper portion of the battery pack 250, so that the battery pack 250 can be coupled with a body of the portable terminal device.

Although the exemplary embodiments have been described, it is understood that the present invention should not be limited to these exemplary embodiments but various changes and modifications can be made by one ordinary skilled in the art within the spirit and scope of the present invention as hereinafter claimed.

INDUSTRIAL APPLICABILITY

The embodiment can provide a battery pack of a portable terminal device.

The embodiment can provide a battery pack including a power control module formed in a single package.

The invention claimed is:

1. A battery pack comprising:
a housing;
a battery cell received in the housing and including a power terminal;
a power control module provided at an opposite side thereof with a battery connection terminal connected with the power terminal, provided at one side thereof with a first connection terminal including a positive terminal and a negative terminal, and having a structure in which a chip part is packaged;
a cell cover coupled with an upper portion of the housing; and
a module connection portion partially exposing an upper surface of the battery cell, protruding from a rear end of an upper portion of the battery cell, wherein the power terminal is disposed on a front surface of the module connection portion where the power control module is electrically connected to the module connection portion;
wherein the battery connection terminal is connected to a front surface of the power terminal;
wherein the power control module is vertically erected and located on the battery cell, and the first connection terminal is exposed through a front portion of the housing;
wherein the power control module includes:
a substrate provided at one side thereof with the chip part including a battery protection circuit;
a resin member for molding the chip part;
the first connection terminal at an opposite side of the substrate;
a second connection terminal at either side of the first connection terminal; and
the battery connection terminal having a first part connected to the second connection terminal, a second part extending along a bottom surface of the resin member, and a third part connected to a side surface of the resin member between the first part and the second part, the third part being bent around one side of the substrate.

2. The battery pack as claimed in claim 1, wherein the battery connection terminal is provided at a rear surface of the power control module, and the first connection terminal is provided at a front surface of the power control module.

3. The battery pack as claimed in claim 1, wherein the housing is provided at an upper portion thereof with a terminal groove to expose the first connection terminal of the power control module.

4. The battery pack as claimed in claim 1, wherein the cell cover is provided at both sides of a lower portion thereof with module guide protrusions to support both sides of the power control module.

5. The battery pack as claimed in claim 1, wherein the cell cover includes a terminal groove to expose the first connection terminal of the power control module.

6. The battery pack as claimed in claim 1, wherein the first connection terminal of the power control module is exposed in a lateral direction of the battery pack.

7. The battery pack as claimed in claim 1, wherein the first connection terminal includes a negative terminal, a positive terminal, and a reference terminal interposed between the negative terminal and the positive terminal.

8. The battery pack as claimed in claim 1, wherein a lower surface of the power control module is in contact with the exposed upper surface of the battery cell.

9. The battery pack as claimed in claim 1, wherein the chip part includes at least one of a single chip form and a multiple chip form.

10. The battery pack as claimed in claim 1, wherein the power control module is interposed between the module connection portion and the housing.

* * * * *